United States Patent
Gierenz et al.

(10) Patent No.: US 7,327,294 B2
(45) Date of Patent: Feb. 5, 2008

(54) GAIN COMPENSATION BASED ON A FIRST GAIN FACTOR AND A SECOND GAIN FACTOR WITH TIME-VARYING COMPENSATION

(75) Inventors: Volker Stefan Gierenz, Aachen (DE); Hendrik Ten Pierick, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/553,550

(22) PCT Filed: Apr. 22, 2004

(86) PCT No.: PCT/IB2004/050487

§ 371 (c)(1),
(2), (4) Date: Oct. 19, 2005

(87) PCT Pub. No.: WO2004/095709

PCT Pub. Date: Nov. 4, 2004

(65) Prior Publication Data

US 2007/0001880 A1    Jan. 4, 2007

(30) Foreign Application Priority Data

Apr. 24, 2003   (EP)  ................................. 03101136

(51) Int. Cl.
*H03M 1/18*    (2006.01)
*H03M 1/00*    (2006.01)

(52) U.S. Cl. .................... 341/139; 341/118

(58) Field of Classification Search ................ 341/143, 341/155, 139, 118, 120
See application file for complete search history.

(56) References Cited

U.S. PATENT DOCUMENTS

| 4,218,733 | A  | * | 8/1980 | Maselli ........................ 700/37 |
| 5,389,927 | A  |   | 2/1995 | Turney et al. .............. 341/139 |
| 5,451,944 | A  | * | 9/1995 | Sogo ............................ 341/61 |
| 6,445,320 | B1 | * | 9/2002 | Noro et al. ................. 341/139 |
| 6,873,831 | B2 | * | 3/2005 | Attar et al. .............. 455/127.2 |
| 7,057,195 | B2 | * | 6/2006 | Cai .......................... 250/559.1 |
| 2003/0083031 | A1 | * | 5/2003 | Eriksson et al. ......... 455/250.1 |
| 2005/0270212 | A1 | * | 12/2005 | Smith et al. ................ 341/155 |

* cited by examiner

Primary Examiner—Peguy JeanPierre (57) ABSTRACT

An automatic gain control circuit has a gain determination circuit (B2) which determines a first gain factor (g), and a first gain controller (B3) which controls an amplitude of an input signal (S1) with the first gain factor (g) to supply a gain controlled signal (S3). A processing circuit (B1; B1, B11) with a predetermined limited dynamic range processes the gain controlled (S3) to obtain an output signal (S4; S2). The automatic gain control circuit further comprises a compensation circuit (B5) which determines a second gain factor (dg) based on the first gain factor (g) and input parameters (DL, TR, DV) which define a time variation of the second gain factor (dg), and a second gain controller (B1; B10) which receives the second gain factor (dg) to obtain a compensated output signal (S2) that is substantially compensated for an amplitude change of the gain controlled signal (S3) due to a change of the first gain factor (g).

18 Claims, 5 Drawing Sheets

GAIN COMPENSATION BASED ON A FIRST GAIN FACTOR AND A SECOND GAIN FACTOR WITH TIME-VARYING COMPENSATION

The invention relates to a device comprising a processing circuit with a predetermined limited dynamic range and an automatic gain control circuit, a method of automatic gain control, and an audio apparatus comprising such a device.

U.S. Pat. No. 5,389,927 discloses that automatic gain control (AGC) is typically used in a receiver to prevent saturation of one or more stages which saturation is caused by exceeding the dynamic range of a stage by a too large input signal. This prior art further discloses that applying AGC techniques to digital receivers as well to control front end gain and digital gain is well known. The control of the front end gain overcomes the problem of insufficient dynamic range of the analog to digital converter (ADC) in digital receivers.

Further, U.S. Pat. No. 5,389,927 discloses that in such a digital receiver with a front end which supplies an analog signal with a level depending on the signal strength received at the antenna, the ADC converts an analog input signal supplied by a front end into a digital signal which is a digital representation of the analog signal. A detector detects the current signal amplitude of the digital signal and supplies a control signal to an amplitude controller which controls the amplitude of the analog input signal in steps to obtain a controlled analog signal which has an amplitude within the operating range of the ADC.

It is an object of the invention to provide an automatic gain control which produces at an amplitude change of a controlled input signal due to an automatic gain control action, a signal amplitude of an output signal which better resembles the amplitude of the input signal.

To this end, a device comprises a processing circuit with a predetermined limited dynamic range, and an automatic gain control circuit comprising:

a gain determining circuit for determining a first gain factor, a first gain controller for controlling an amplitude of an input signal with the first gain factor to supply a gain controlled signal to the processing circuit, a compensation circuit for determining a second gain factor based on the first gain factor and input parameters defining a time variation of the second gain factor, and a second gain controller for receiving an output signal of the processing circuit and the second gain factor to obtain a compensated output signal being substantially compensated for an amplitude change of the gain controlled signal due to a change of the first gain factor.

The device with the automatic gain control circuit in accordance with the invention controls an amplitude of the input signal with a first gain factor to supply a gain controlled signal. The processing circuit processes the gain controlled signal into a processed signal. A second gain controller controls a gain of the processed signal with a second gain factor to obtain a compensated output signal which is substantially compensated for an amplitude change of the gain controlled signal due to a change of the first gain factor. The second gain factor is based on the first gain factor and input parameters which define a time variation of the second gain factor. Thus, when, at a particular instant, the first gain factor is changed, the second gain factor is adapted in such a way that the amplitude of the compensated output signal is substantially constant of course only if the input signal does not change during the transition period. In more general, the compensated output signal is compensated such that it better follows the input signal and thus is less disturbed by the variation of the first gain factor. This is especially important in audio applications. Any disturbance, even if temporarily only, of the amplitude of the compensated output signal will result in audible distortion of the signal. The first gain factor is supplied both to the automatic gain control circuit to change the amplitude of the input signal, and to the compensation circuit to indicate the instant and/or amount of the change of amplitude of the input signal.

The prior art U.S. Pat. No. 5,389,927 controls the analog signal amplitude in factors of two. If the digital signal is controlled in factors of two in the opposite direction of the amplitude change of the controlled analog signal, the difference between the analog signal and the digital signal is reasonably small during the amplitude adaptations. However, the waveform of the digital signal temporarily deviates from the amplitude of the analog input signal when the amplitude of the controlled analog signal is changed. This causes an audible distortion every time the step change of the amplitude of the controlled analog signal is required. This audible distortion has to be filtered out which deteriorates the audio quality.

In an embodiment in accordance with invention, the processing circuit comprises an analog to digital converter ADC. The device with the automatic gain control circuit in accordance with the invention controls an amplitude of the analog input signal with a first gain factor to supply a gain controlled analog signal. The first gain factor is determined such that the current signal amplitude of the digital signal does not exceed the input range of the ADC. The ADC converts the gain controlled analog signal into a digital signal. A second gain controller controls a gain of the digital signal with a second gain factor to obtain a compensated digital signal which is substantially compensated for an amplitude change of the gain controlled analog signal due to a change of the first gain factor. The second gain factor is based on the first gain factor and input parameters which define a time variation of the second gain factor. Thus, the compensated digital signal is compensated such that it better follows the analog input signal and thus is less disturbed by the variation of the first gain factor.

With the current signal amplitude of the digital signal is meant the maximum value the digital signal has or is expected to have. The bits of the digital signal word may be generated by the analog to digital converter directly in parallel, it is also possible that the analog to digital converter supplies the bits of the word serially.

In an embodiment in accordance with the invention, the gain control provides an input signal which fits within the operating range of the ADC and thus prevents that at a too large amplitude of the analog input signal will be clipped by the analog to digital conversion, or that a large part of the range of the ADC is not used.

In an embodiment in accordance with the invention, the first gain factor is adapted in steps, this is simpler than to cater for a continuously variable first gain factor.

In an embodiment in accordance with the invention, the first gain factor is changed in steps which are a power of two. This allows a change of the digital amplitude by bit-shifting, which is very simple.

In an embodiment in accordance with the invention, a delay circuit delays a start instant of the controlling of the amplitude of the output signal of the processing circuit. When the first gain factor is changed, the analog gain is adapted immediately. The second gain should however not be adapted immediately. It takes some time before the adaptation of the analog gain is noticeable in the output signal of the processing circuit. This delay is caused by a processing time of the processing circuit between the gain controlled signal and the compensated digital signal. Thus, the second gain factor should start changing after this delay. If the processing circuit comprises an ADC, the second gain factor is also referred to as the digital gain factor.

In an embodiment in accordance with the invention, the compensation circuit comprises a waveform generation circuit which generates a waveform determining the time variation of the second gain factor. If the first gain factor is changed with a step, the amplitude of the gain controlled signal will change with a step. However, the amplitude of the output signal of the processing circuit will not vary stepwise. The processing circuit (which may comprise an ADC and, optionally, other digital circuits such as digital filters) cause the step variation of the gain controlled signal to become smeared out in time, for example due to bandwidth limitations. Thus, if an amplitude of the compensated signal is required which is less disturbed by the step variation of the gain controlled signal, the second gain should vary in time in accordance with a well defined waveform to compensate the smeared-out response.

In an embodiment in accordance with the invention, the waveform generating circuit comprises a bandwidth limitation circuit to obtain the smeared-out change of the second gain factor corresponding to the smear out effect of the processing circuit. It is also possible to approximate or obtain the same behavior by using a linear interpolation, or even better a higher order interpolation, or by using a table look-up or a line drawing algorithm.

In an embodiment in accordance with the invention, a static error is compensated for. If the first gain factor indicates that the amplitude of the analog signal should change a predetermined amount, actually a slight deviation from this predetermined amount might occur. It is not sufficient to compensate the amplitude of the output signal of the processing circuit with exactly the same predetermined amount. After the transition period, when the delay and the waveform of the second gain factor are not important anymore, still a difference is present between the amplitude of the compensated signal and the original input signal. This difference is compensated for by the level adaptation circuit.

In an embodiment in accordance with the invention, a well known single bit sigma-delta analog to digital converter is used. Such an analog to digital converter is simple. A further advantage is that the gain compensation operates on a single-bit signal instead of a multi-bit signal thus removing the need for an explicit multiplication.

In an embodiment in accordance with the invention, the digital gain is controlled at the ADC directly. An example of a suitable ADC is an ADC with a possibility to control its reference.

In an embodiment in accordance with the invention, the digital gain (the second gain factor) is controlled by a digital gain controller (the second gain controller) which processes the digital signal (the processed signal) supplied by the ADC. The ADC may now be of any kind.

In an embodiment in accordance with the invention, the processing circuit may comprise further digital processing (for example a digital filter). The gain compensation is obtained by controlling the amplitude of the processed digital signal supplied by the digital processing circuit.

In an embodiment in accordance with the invention, both the gain of the digital signal supplied by the ADC and the gain of the processed digital signal supplied by the digital processing circuit are controlled.

In an embodiment in accordance with the invention, an automatic calibration circuit performs during a test period, repeatedly the next operations:

generating a reference signal being supplied as the input signal, adapting the first gain factor with a predetermined amount, providing a first set of input parameters, checking whether a change of amplitude occurs of the compensated output signal, and adapting at least one of the input parameters, until substantially no change of amplitude occurs of the compensated output signal, and finally storing the input parameters determined, for use during normal operation.

These and other aspects of the invention are apparent from and will be elucidated with reference to the embodiments described by way of example in the following description and with reference to the accompanying drawings, in which.

In the Figures, elements which correspond to elements described previously have the same reference numerals.

Figure 1:
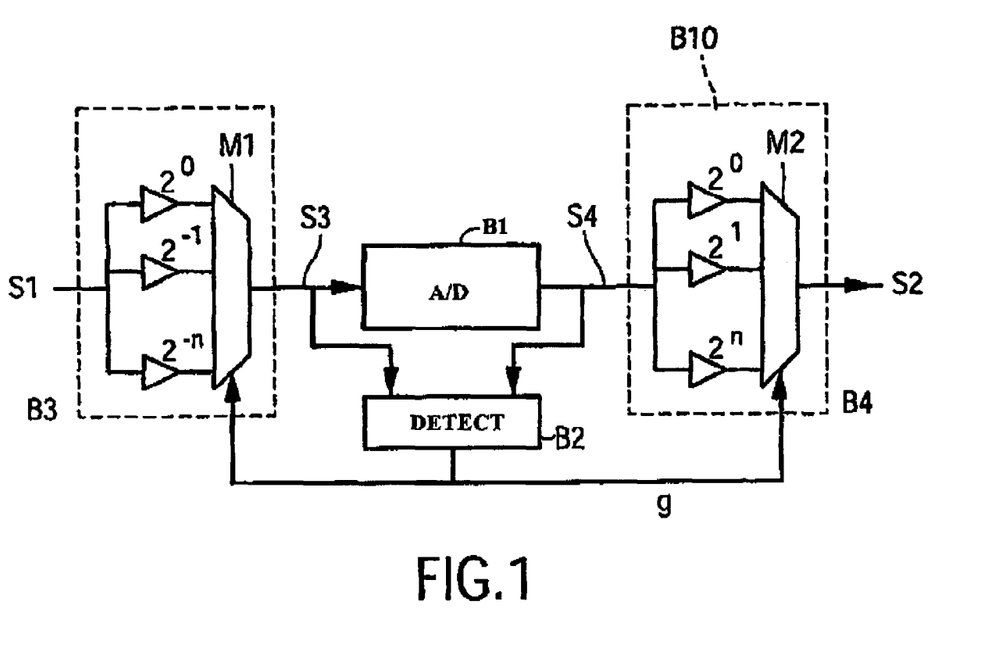
FIG. 1 shows a simple gain compensation circuit.
Figure 2A:
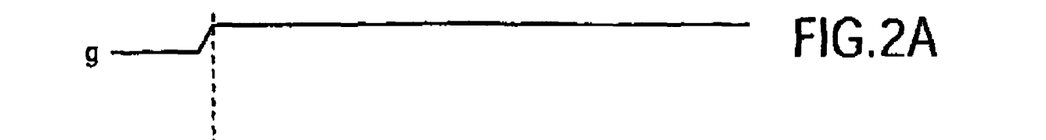
FIG. 2 shows signals for elucidating the operation of the gain compensation circuit shown in FIG. 1.
Figure 2B:
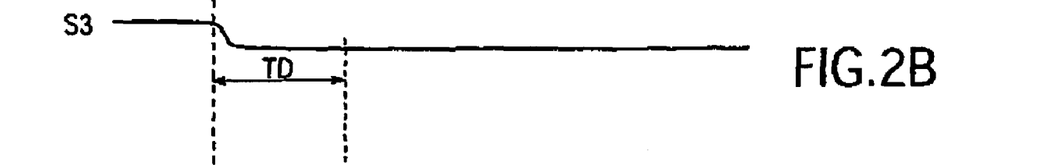
Figure 2C:
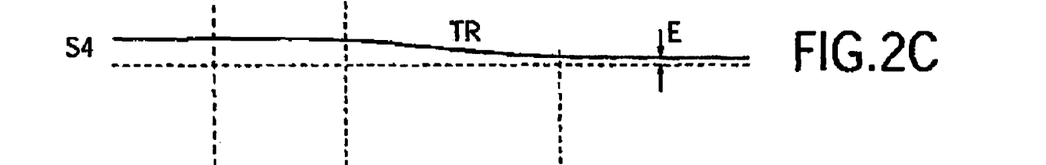
Figure 2D:
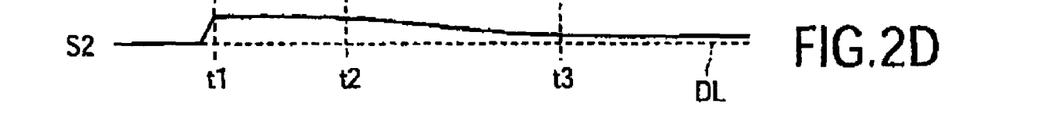

FIG. 1 shows a simple gain compensation circuit. A gain circuit B3 receives a gain control signal referred to as gain factor g, an analog input signal S1 which has a certain dynamic range and bandwidth and supplies a gain controlled analog signal S3 to the analog to digital converter B1. The gain circuit B3 usually is an attenuating circuit. The attenuating circuit may comprise a number of attenuators (indicated by $2^0$, $2^{-1}$, $2^{-n}$) which attenuate the analog input signal S1 with factors which are powers of the number 2. It is possible to use other factors. A multiplexer M1 selects the attenuator output signal(s) fitting the gain factor g. The ADC B1 converts the gain controlled analog input signal S3 into a digital signal S4.

A detection circuit B2 continuously checks the current signal level of the digital signal S4 and compares this level to the maximum allowable input-level of the ADC B1. If the level of the digital signal S4 approaches the maximum allowable level, the detection circuit B2 adapts the gain factor g to obtain a same attenuation factor g of the gain circuit B3. The scaling of the ADC B1 output signal, which is the digital signal S4, introduced by the attenuating circuit B3 is later compensated by a digital gain controller B10 which amplifies the digital signal S4 by the same factor g to obtain a digital output signal S2 which has an amplitude which is as constant as possible.

For an efficient implementation of the digital gain controller B10, often the attenuating circuit B3 comprises the above mentioned set of fixed attenuation factors which are powers of 2, which thus gives rise to attenuation in multiples of 6 dB. The digital gain controller B10 increases the amplitude of the digital signal S4 in steps of 6 dB by simply shifting the bits of the digital word by one bit. In fact, more generally, the attenuation-factor g determines an attenuation-factor (the powers of 2 indicated in the digital gain controller B10) selection (by the multiplexer M2) in the digital gain controller B10.

The switching of the attenuation factor g of the attenuating circuit B3 happens almost instantaneously, resulting in a step-wise amplitude change in the gain controlled analog signal S3. Due to the bandwidth limitation inherently present in the system, for example, due of the ADC B1, this step is spread out, and after some delay TD (see FIG. 2) the step results in a relatively slow transient TR of the digital signal S4. In addition to the delay TD and the transient TR, there is a setting-dependent deviation E from the ideal attenuation due to process-spread and non-idealities in the analog design. In this simple gain compensation circuit, the attenuation is compensated by a step and the digital output signal S2 is temporarily distorted. This is illustrated with respect to FIG. 2.

Depending on the application, all these distortions result in unwanted and noticeable artifacts. For example, in case of AM-reception, these distortions give rise to a click-noise in the output audio signal which either has to be filtered out or muted, and thus leads to inferior audio quality. This effect becomes worse if the AGC switches periodically or with a certain periodicity.

FIG. 2 shows signals for elucidating the operation of the simple gain compensation circuit. FIG. 2A shows the gain factor g which increases almost stepwise at instant t1. This indicates to the gain circuit B3 that the amplitude of the gain controlled analog signal S3 should decrease a predetermined amount, and to the digital gain controller B10 to increase the amplitude of the digital signal S4 with the same predetermined amount. FIG. 2B shows the stepwise decrease of the amplitude of the gain controlled analog signal S3. FIG. 2C shows the change of the digital signal S4 in response to the step of the amplitude of the gain controlled analog signal S3. The amplitude of the digital signal S4 starts decreasing at an instant t2 which is a delay time TD later than instant t1 at which the gain controlled analog signal S3 decreases. During a transition period TR (also referred to as the transition TR), the amplitude of the digital signal S4 decreases to its final level. The final level which is reached at instant t3 may have an offset or error E with respect to the expected level. FIG. 2D shows the compensated digital signal S2. The gain factor g of FIG. 2A corrects the digital signal S4 by enlarging the gain of the digital gain controller B10 at the instant t1 at which the digital signal 84 is not changed due to the stepwise change of the gain controlled analog signal S3. Consequently, the amplitude of the compensated digital signal S2 is too large. At instant t2 the too large amplitude of the compensated digital signal S2 starts decreasing due to the decreasing amplitude of the digital signal S4. After instant t3, the desired level DL is reached, only the error B will still be present.

Due to the imperfect compensation, a much too high amplitude of the compensated digital signal occurs from instant t1 to instant t3. This distortion will be audible in audio systems. A much too low amplitude of the compensated digital signal will occur if the step occurs in the other direction.

Figure 3:
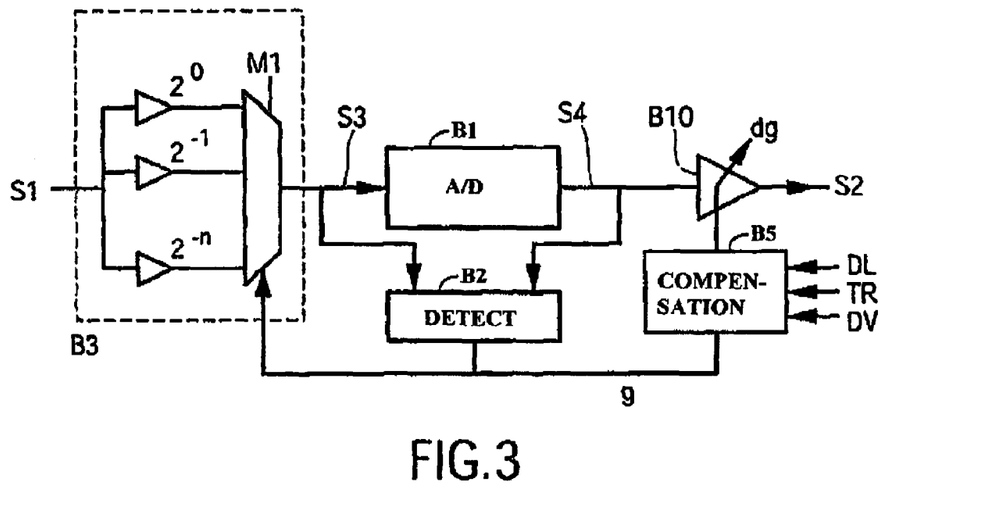
FIG. 3 shows a block diagram of the gain compensation circuit in accordance with an embodiment of the invention.
Figure 4A:
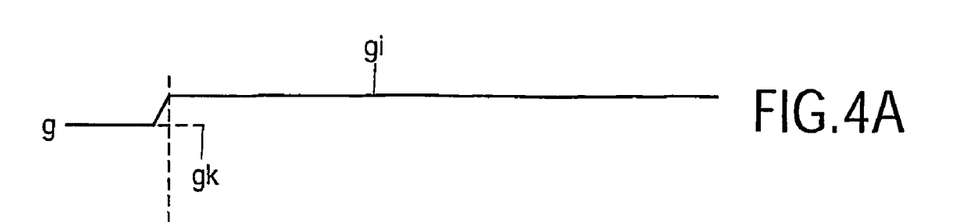
FIG. 4 shows signals for elucidating the operation of the gain compensation circuit shown in FIG. 3.
Figure 4B:
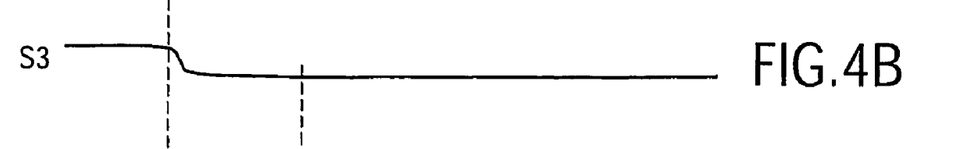
Figure 4C:
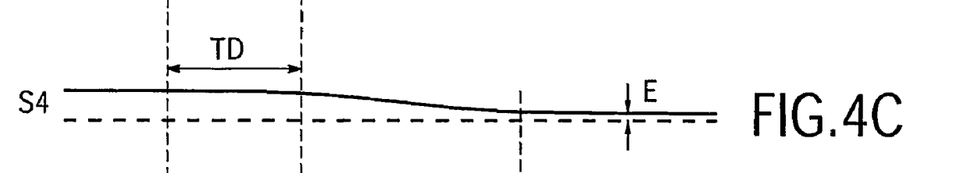
Figure 4D:
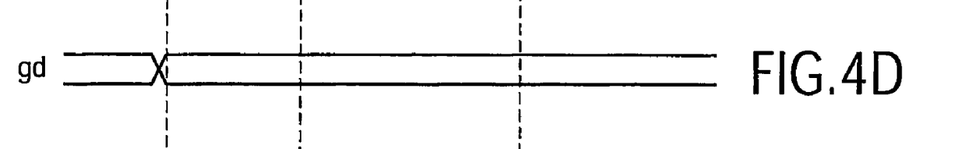
Figure 4E:
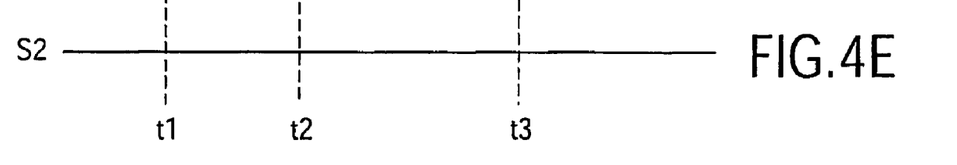

FIG. 3 shows a block diagram of the gain compensation circuit in accordance with an embodiment of the invention.

The gain circuit B3 receives a gain control signal referred to as gain factor g, and an analog input signal S1, and supplies a gain controlled analog signal S3 to the analog to digital converter B1. The gain circuit B3 may be identical to the gain circuit B3 described with respect to FIG. 1. The ADC B1 converts the gain controlled analog input signal S3 into a digital signal S4.

A detection circuit B2 continuously checks the current signal level of the digital signal S4 and compares this level to the maximum allowable input-level of the ADC B1. If the level of the digital signal S4 approaches the maximum allowable level, the detection circuit B2 adapts the gain factor g to obtain a same attenuation factor g of the attenuating circuit B3. The scaling of the ADC B1 output signal, which is the digital signal S4, introduced by the attenuating circuit B3 is later compensated by a digital gain controller B10. A compensation circuit B5 determines a digital gain factor dg based on both the gain factor g which comprising information on when the gain factor is changed and by how much and on parameters DL, TR, DV which determine the variation in time of the digital gain factor dg. The digital gain controller B10 controls the gain of the digital signal S4 with a factor determined by the digital gain factor dg to obtain a digital output signal S2 which has an amplitude which is substantially constant or more precisely defined if the input signal is varying: an amplitude which is substantially undisturbed.

The main idea of the compensation circuit in accordance with a preferred embodiment of the invention is to implement a gain compensation which substantially perfectly compensates for the non-idealities described with respect to the simple compensation as elucidated with respect to FIGS. 1 and 2. In principle the substantially perfect compensation is obtained by means of time-varying the gain of the digital gain controller B10 in such a way that the artifacts in the compensated digital signal S2 are substantially removed.

The compensation circuit B5 generates a digital gain factor dg which is complementary to all the distortions seen at the point in the processing chain where the gain compensation is performed. This digital gain factor dg is used as a compensation signal for the digital gain controller B10. In principle, in a preferred optimal compensation scheme, the digital gain factor dg is determined based on the gain factor g, the delay TD, the transition characteristics of the transition TR and the error E. The compensation circuit B5 thus generates a digital gain dg with a programmable delay, start-gain, end-gain and transition characteristics. The digital gain in accordance with the invention thus is not just a step-wise compensation which occurs coincident with the change of the gain factor, but has at least either a delay, a changing value, or on static error compensation component.

The digital gain controller B10 may be identical to the one described with respect to FIG. 1.

FIG. 4 shows signals elucidating the operation of the gain compensation circuit shown in FIG. 3. FIG. 4A shows the gain factor g which switches from attenuation factor gk to gi at instant t1. The gain controlled analog signal S3 which is the ADC B1 input signal almost immediately responds to the new setting of the attenuating circuit B3 as is shown in FIG. 4B. This new setting deviates with a setting depending deviation E from the ideal attenuation. The analog to digital conversion by the ADC B1 introduces a processing delay TD. The gain compensation circuit B5 generates the digital gain factor dg as shown in FIG. 4D. The digital gain factor dg starts increasing at instant t2 which is the delay time TD later than the instant t1. The digital gain factor dg increases until the instant t3 along a curve which is complement to the corresponding curve of the amplitude error of the digital signal S4 if not compensated. After instant t3, the digital gain factor dg has a value suitable to compensate for the error E. The distortions are substantially perfectly compensated in the compensated digital signal S2 as shown in FIG. 4E. It is not required that all the aspects are compensated. The compensated digital signal S4 has a less distorted amplitude than in the prior art even when the error E is not or not fully compensated. It is also not required to perfectly compensate during the transition period. A rough estimation of the optimal curve during the transition period will improve the behavior of the compensation circuit over the prior art. An improvement over the prior art is obtained also when at least one of the effects of delay time TD, the transition period TR, or the error E is compensated to at least some extend.

The shape of the curve of the digital gain dg during the transition period TD may be obtained by linear interpolation of two or more value/time pairs which preferably are obtained from a memory (not shown). A better accuracy may be reached by using a higher order interpolation. Alternatively, well known methods like table look-up or line-drawing algorithms can be used depending on a trade-off between accuracy and effort.

Preferably, all the parameters determining the variation of the digital gain factor dg during the transition period TR, the duration of the delay period TD, and the setting-dependent deviation or error E are user programmable.

Figure 5:
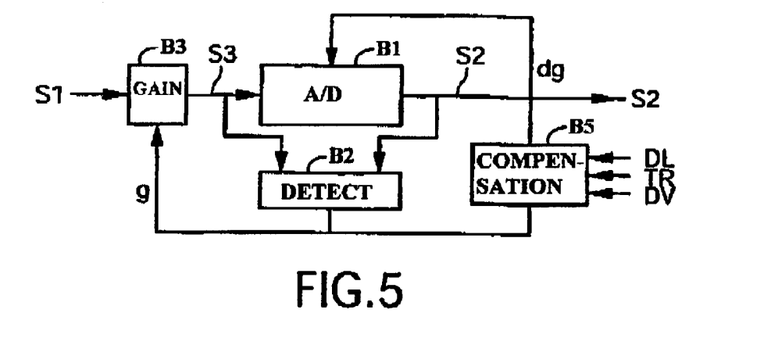
FIG. 5 shows a block diagram of the gain compensation circuit of an embodiment in accordance with the invention.

FIG. 5 shows a block diagram of an embodiment in accordance with the invention of the gain compensation circuit.

The gain circuit B3 receives a gain control signal referred to as gain factor g, an analog input signal S1 and supplies a gain controlled analog signal S3 to the analog to digital converter B1. The ADC B1 further comprises an input to receive the digital gain factor dg and converts the gain controlled analog input signal S3 into a gain compensated digital signal S2. A detection circuit B2 continuously checks the current signal amplitude of the compensated digital signal S2 and/or the gain controlled analog signal S3 to determine the gain factor g. A compensation circuit B5 determines the digital gain factor dg based on the gain factor g, and the parameters for the duration of the delay period TD, for the shape of the gain variation during the transition period TR, and the error E.

This digital gain control in the ADC B1 is in particular relevant for ADC's of which the reference can be controlled.

Figure 6:
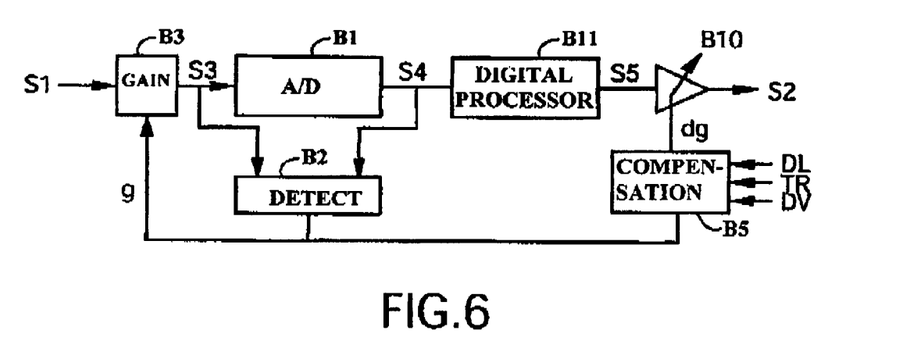
FIG. 6 shows a block diagram of the gain compensation circuit of an embodiment in accordance with the invention.

FIG. 6 shows a block diagram of an embodiment in accordance with the invention of the gain compensation circuit.

The controllable variable gain circuit B3 receives the gain factor g, the analog input signal S1 and supplies the gain controlled analog signal S3 to the analog to digital converter B1 which converts the gain controlled analog signal S3 into a digital signal S4. A detection circuit B2 continuously checks the current signal amplitude of the digital signal S4 and/or the gain controlled analog signal S3 to determine the gain factor g. A digital processing circuit B11 receives the digital signal S4 and supplies the processed digital signal S5 to the digital gain controller B10 to obtain the compensated digital signal S2. The compensation circuit B5 determines the digital gain factor dg based on the gain factor g, and the parameters for the duration of the delay period TD, for the shape of the gain variation during the transition period TR, the error E, and the processing in the processing circuit B11. The digital gain factor dg is supplied to the digital gain controller B10 to control the amplitude of the processed digital signal S5. The digital processing circuit B11 may perform decimation filtering.

The compensation of the gain variation by the gain circuit B3 in the analog domain is compensated in the digital domain behind the digital processing circuit B11. This has the advantage that if the digital processing circuit B11 comprises a sample rate down-converter, or a decimation filter that the compensation is performed on a signal with a lower sample rate.

Figure 7:
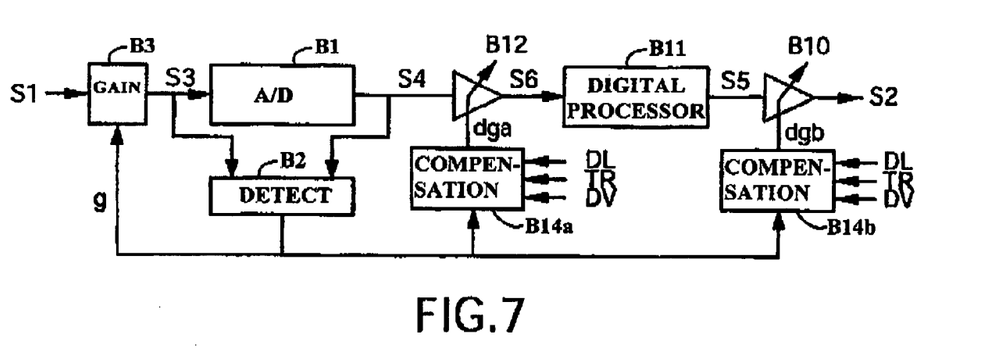
FIG. 7 shows a block diagram of the gain compensation circuit of an embodiment in accordance with the invention.

FIG. 7 shows a block diagram of an embodiment in accordance with the invention of the gain compensation circuit.

The controllable variable gain circuit B3 receives the gain factor g, the analog input signal S1 and supplies the gain controlled analog signal S3 to the analog to digital converter B1 which converts the gain controlled analog input signal S3 into a digital signal S4. A detection circuit B2 continuously checks the current signal amplitude of the digital signal S4 and/or the gain controlled analog signal S3 to determine the gain factor g. A digital gain controller B12 receives the digital signal S4 to supply an intermediate compensated digital signal S6. A digital processing circuit B11 receives the intermediate compensated digital signal S6 and supplies the processed digital signal S5 to the digital gain controller B10 to obtain the compensated digital signal S2. A compensation circuit B14a determines the digital gain factor dga based on the gain factor g, and the parameters for the duration of the delay period TD, for the shape of the gain variation during the transition period TR, and the error E. The digital gain factor dga is supplied to the digital gain controller B12 to control the amplitude of the digital signal S4. A compensation circuit B14b determines the digital gain factor dgb based on the gain factor g, and the parameters for the duration of the delay period TD, for the shape of the gain variation during the transition period TR, the error E, and the processing of the processing circuit B11. The digital gain factor dgb is supplied to the digital amplifier B10 to control the gain of the processed digital signal S5.

Now the compensation of the of the gain variation by the gain circuit B3 in the analog domain is compensated in the digital domain partly directly behind the ADC B1 and partly behind the digital processing circuit B11. This has the advantage that if the digital processing circuit B11 comprises a sample rate down-converter, or a decimation filter that the compensation is performed on a signal with a lower sample rate.

Figure 8:
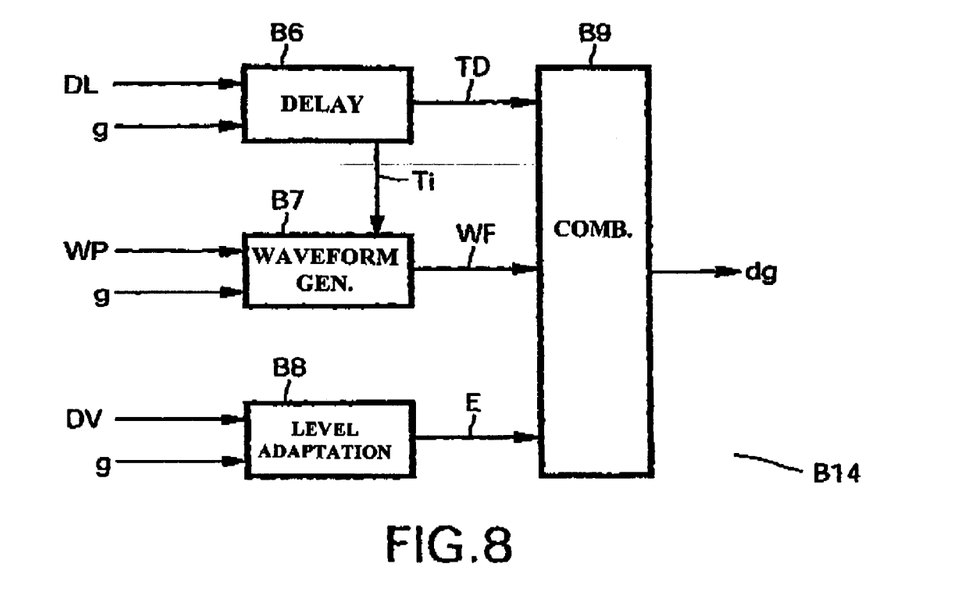
FIG. 8 shows an embodiment in accordance with the invention of a digital gain controller.

FIG. 8 shows an embodiment in accordance with the invention of a compensation circuit.

The compensation circuit B5 or B14b, B14b comprises a delay circuit B6, a waveform generating circuit B7, a level adaptation circuit B8 and a combining circuit B9.

The delay circuit receives B6 the gain factor g and a delay parameter DL to supply the delay time TD. The delay time TD indicates an instant a delay time TD later than the instant at which the gain factor g changes. The duration of the delay time TD is determined by the delay parameter DL. The delay parameter may be stored in memory.

The waveform generating circuit B7 receives the gain factor g and at least one waveform parameter WP defining the waveform information WF according which the digital gain dg has to vary during the transition period TR. The waveform generating circuit B7 may receive timing information TI from the delay circuit B6 which at least indicates the start of the transition period. The waveform parameter WP may comprise the timing information on the duration of the transition period and also on the start of the transition period with respect to the instant the gain factor g changes. The waveform parameter WP further comprises one or more values determining the desired waveform information WF. The gain factor g provides information on the required amount the digital gain dg should vary, and on the instant the gain in the analog domain is changed. However, this timing instant may not be used as it may be present in the timing information TI. The waveform generating circuit B7 may receive information on a correction required to compensate for the influence of a processing circuit B11 if present.

The level adaptation circuit B8 receives a delta gain factor DV and the gain factor g to determine the amount the digital gain dg has to change, and on the instant the gain in the analog domain is changed. The delta gain factor DV indicates the value for the offset or error information E required to obtain a perfect compensation after the transition period TR. The timing information (obtained from the gain factor g or from the delay circuit B6) may be used to activate this compensation during or after the transition period TR.

The combining circuit B9 combines the delay parameter DL, the waveform information WF and the error information E to obtain the time-varying digital gain or digital gain factor dg.

Figure 9:
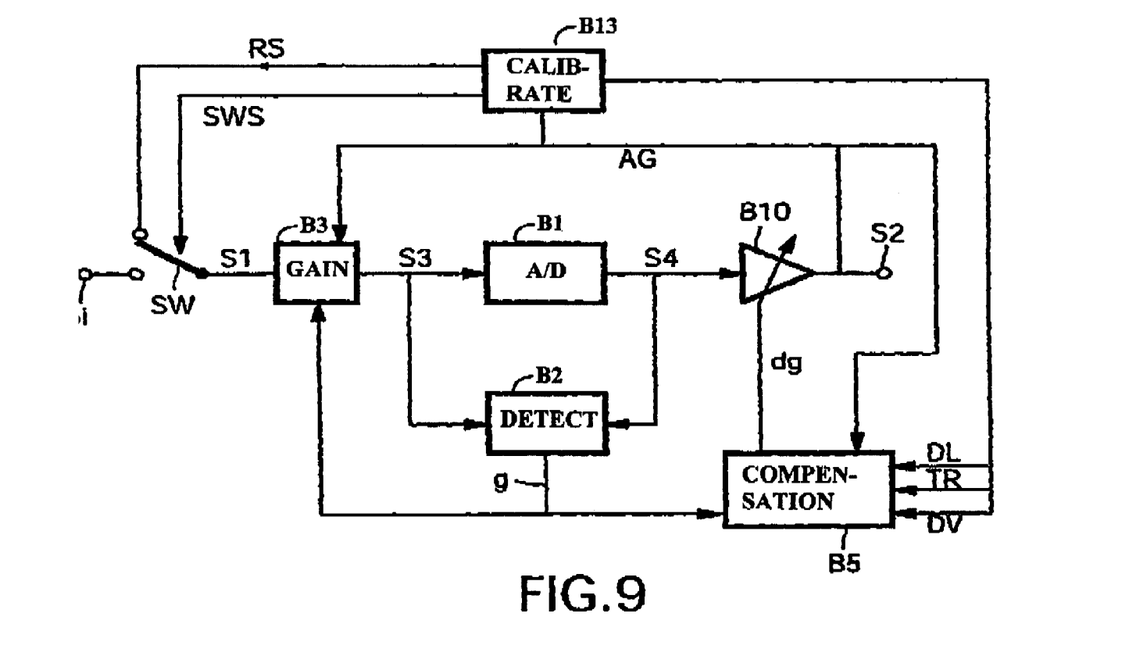
FIG. 9 shows an embodiment in accordance with the invention of an automatic calibration circuit.

FIG. 9 shows an embodiment in accordance with the invention of an automatic calibration circuit. The circuit shown in FIG. 9 is based on the circuit shown in FIG. 3. An automatic calibration circuit B13 and a switch SW are added. The automatic calibration circuit B13 receives the compensated digital signal S2, and supplies: a switch control signal SWS to the switch SW, the parameters DL, TR, and OV to the compensation circuit B5, and a control signal AG to the gain circuit B3 and the compensation circuit B5.

During a calibration period, the automatic calibration circuit B13 first sets the parameters DL, TR and OV. Secondly, the automatic calibration circuit B13 supplies a reference signal RS with a predetermined level as the analog signal S1 to the controllable variable gain circuit B3 because the switch SW is in the position shown. Then, the automatic calibration circuit B13 provides the information AG to the gain circuit B3 and the compensation circuit B5 to indicate the instant at which the gain of the gain circuit B3 and the digital gain controller B10 has to be changed. Instead of supplying the information AG directly to the gain circuit B3 and the compensation circuit B5, the information AG may also control the gain factor g. Now, the automatic calibration circuit B13 evaluates the amplitude of the compensated digital signal S2.

If the amplitude of the compensated digital signal S2 is sufficiently constant in time, the parameters DL, TR and OV used are stored and normal operation is resumed. During normal operation, the switch SW is in the position not shown in FIG. 9 and the automatic calibration circuit is inactive.

If the amplitude of the compensated digital signal S2 is not sufficiently constant in time, the automatic calibration circuit B13 varies one or more of the parameters DL, TR and OV and restarts a calibration cycle. The automatic calibration circuit B13 repeats the calibration cycle as often as required to obtain a substantially constant compensated digital signal S2 in response to a change of the gain factor g. At the end of the last calibration cycle the optimal parameters DL, TR and OV found are stored for use during the normal operation phase.

Many strategies can be used to find the optimal parameters DL, TR and OV. For example, by determining at which instant the compensated digital signal deviates from the required level. For example, when a deviation occurs near to the instant the gain factor g is changed, the parameter DL should be adapted to get a longer delay time TD, if a long time after this instant an error is present, the parameter OV should be changed to lower the error E. The remaining error can be minimized by sampling the deviation during the transition period and by using the sampled values in the parameter TR.

The general context of this invention is the technique of automatic gain control in combination with analog to digital converters used in various kinds of applications, e.g. radio receivers, wire-line communication, data transceivers etc.

An example of an implementation is elucidated in the now following. The compensation circuit or the corresponding compensation method described has been implemented in hardware on a test-chip in the context of a digitally implemented analog broadcast AM/FM radio receiver for car-radio applications. For a hardware-efficient solution a single-bit sigma-delta ADC is used. The test-chip comprises a set of 4 attenuator settings. The digital gain compensation is performed as early as possible in the system, which is immediately on the bit-stream of the ADC. This has the advantage of low hardware effort since the gain compensation operates on a single signal-bit instead of a multi-bit-bus thus removing the need for explicit multiplication. To compensate during the transient period TR, linear interpolation showed to provide good performance in that the remaining disturbances were not audible. The user programmable parameters DL, TR and OV are the duration of the delay period TD, the slope of the linear interpolated waveform of the digital gain during the transition period TR, and four attenuator setting dependent gain deviations E, respectively.

This method of compensation can be used, for example, in the following applications: in general applications which use an ADC and stepped AGC's, in integrated circuits for e.g. car-radio, cellular phones, portable radio etc. RF-, LF-, and baseband-processing, and in audio (HiFi-) equipment. The method of compensation is also useful in systems without an ADC. Usually, processing circuits are used which have a limited dynamic range. Often the dynamic range is limited by the power supply voltages applied. In particular if circuits are integrated in an integrated circuit, the dynamic range of these circuits may be quite limited due to relatively low supply voltages. The amplitude of the input signal of such processing circuits is controlled by a first gain control circuit preceding the processing circuit. The effect of the first gain control circuit is substantially compensated by providing a second gain control circuit operating on the output signal of the processing circuit to restore the amplitude of the output signal.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A device comprising a processing circuit (B1; B1, B11) with a predetermined limited dynamic range, and an automatic gain control circuit comprising:
   a gain determining circuit (B2) for determining a first gain factor (g),
   a first gain controller (B3) for controlling an amplitude of an input signal (S1) with the first gain factor (g) to supply a gain controlled signal (S3) to the processing circuit (B1; B1, B11),
   a compensation circuit (B5) for determining a second gain factor (dg) based on the first gain factor (g) and input parameters (DL, TR, DV) defining a time variation of the second gain factor (dg), and
   a second gain controller (B1; B10) for receiving an output signal of the processing circuit (B1; B1, B11) and the second gain factor (dg) to obtain a compensated output signal (S2) being substantially compensated for an amplitude change of the gain controlled signal (S3) due to a change of the first gain factor (g).

2. A device as claimed in claim 1, wherein the processing circuit (B1; B1, B11) comprises an analog to digital converter (B1) for converting the gain controlled signal (S3) into a digital signal (S4; S2), the output signal of the processing circuit (B1; B1, B11) being a digital signal (S4), and the compensated output signal (S2) being a compensated digital signal (S2).

3. A device as claimed in claim 2, wherein the gain determining circuit (B2) has inputs for receiving the gain controlled signal (S3) and/or the digital signal (S4) and an output for supplying the first gain factor (g), the first gain factor (g) being determined to obtain the amplitude of the gain controlled signal (S3) fitting within an operating range of the analog to digital converter (B1).

4. A device as claimed in claim 3, wherein the gain determining circuit (B2) is arranged for adapting the first gain factor (g) in steps.

5. A device as claimed in claim 4, wherein the steps comprise powers of the number two.

6. A device as claimed in claim 2, wherein the analog to digital converter (B1) is of a single bit sigma-delta type.

7. A device as claimed in claim 2, wherein the analog to digital converter (B1) comprises the second gain controller (B1; B10) for controlling the gain of the digital signal (S4) to supply the compensated digital signal (S2).

8. A device as claimed in claim 2, wherein the second gain controller (B1; B10) is arranged for controlling the gain of the digital signal (S4) supplied by the analog to digital converter (B1).

9. A device as claimed in claim 2, wherein the processing circuit (B1; B1, B11) comprises a digital processing circuit (B11) for processing the digital signal (S4) supplied by the analog to digital converter (B1) to obtain a processed digital signal (S5), and wherein the second gain controller (B10) is arranged for controlling a gain of the processed digital signal (S5) with the second gain factor (dg).

10. A device as claimed in claim 9, further comprising a digital gain controller (B12) being arranged between the analog to digital converter (B11) and the digital processing circuit (B11), the digital gain controller (B12) being controlled by a further digital gain factor (dga).

11. A device as claimed in claim 1, wherein the compensation circuit (B5) comprises a delay circuit (B6) for delaying a start instant of a change of the second gain factor (dg) in response to the change of the first gain factor (g) to substantially compensate for a processing time of the processing circuit (B1; B1, B11) causing a time delay (TD) between the gain controlled signal (S3) and the compensated output signal (S2).

12. A device as claimed in claim 1, wherein the compensation circuit (B5) comprises a waveform generating circuit (B7) for generating a waveform (WF) of the time variation of the second gain factor (dg).

13. A device as claimed in claim 12, wherein the waveform generating circuit (B7) comprises a bandwidth limitation circuit, or a linear interpolation circuit, or a higher order interpolation circuit, or a table look up circuit, or a line drawing algorithm circuit.

14. A device as claimed in claim 1, wherein the compensation circuit (B5) comprises a level adaptating circuit (B8) for generating a DC-offset of the second gain factor (dg) to substantially compensate for a static level deviation (E) of the compensated output signal (S2).

15. A device as claimed in claim 1, further comprising an automatic calibration circuit (B13) being arranged for, during a test period (TP), repeatedly:
   generating a reference signal (RS) being supplied as the input signal (S1),
   adapting the first gain factor (g) with a predetermined amount,
   providing a first set of input parameters (DL, TR, DV),
   checking whether a change of amplitude occurs of the compensated output signal (S2), and
   adapting at least one of the input parameters (DL, TR, DV), until substantially no change of amplitude occurs of the compensated output signal (S2), and
   finally storing the input parameters (DL, TR, DV) determined, for use during normal operation.

16. A method of automatic gain control in a device comprising a processing circuit (B1; B1, B11) with a predetermined limited dynamic range, the method comprising:
   determining (B2) a first gain factor (g),
   controlling (B3) an amplitude of an input signal (S1) with the first gain factor (g) to supply a gain controlled signal (S3) to the processing circuit (B1; B1, B11),
   determining (B5) a second gain factor (dg) based on the first gain factor (g) and input parameters (DL, TR, DV) defining a time variation of the second gain factor (dg), and
   controlling (B1; B10) with the second gain factor (dg) an output signal of the processing circuit (B1; B1, B11) to obtain a compensated output signal (S2) being substantially compensated for an amplitude change of the gain controlled signal (S3) due to a change of the first gain factor (g).

17. A method of automatic gain control as claimed in claim 16, further comprising an automatic calibration (B13) comprising, during a test period, repeatedly:
   generating a reference signal (RS) being supplied as the input signal (S1),
   adapting the first gain factor (g) with a predetermined amount,
   providing a first set of input parameters (DL, TR, DV),
   checking whether a change of amplitude occurs of the compensated output signal (S2), and
   adapting at least one of the input parameters (DL, TR, DV), until substantially no change of amplitude occurs of the compensated output signal (S2), and
   finally storing the input parameters (DL, TR, DV) determined, for use during normal operation.

18. An audio apparatus comprising a processing circuit (B1; B1, B11) with a predetermined limited dynamic range, and an automatic gain control circuit comprising:
- a gain determining circuit (B2) for determining a first gain factor (g),
- a first gain controller (B3) for controlling an amplitude of an input signal (S1) with the first gain factor (g) to supply a gain controlled signal (S3) to the processing circuit (B1; B1, B11),
- a compensation circuit (B5) for determining a second gain factor (dg) based on the first gain factor (g) and input parameters (DL, TR, DV) defining a time variation of the second gain factor (dg), and
- a second gain controller (B1; B10) for receiving an output signal of the processing circuit (B1; B1, B11) and the second gain factor (dg) to obtain a compensated output signal (S2) being substantially compensated for an amplitude change of the gain controlled signal (S3) due to a change of the first gain factor (g).

* * * * *